United States Patent [19]

Rydergren et al.

[11] Patent Number: 5,187,437
[45] Date of Patent: Feb. 16, 1993

[54] MAGNETIC FIELD DETECTOR FOR DETECTING EARTH'S MAGNETIC FIELD

[75] Inventors: Bertil Rydergren, Skarholmen; Jan Silfven, Saltsjo-Boo; Roger Malmhall, Västerås, all of Sweden

[73] Assignee: Instrumentverken AB, Sweden

[21] Appl. No.: 637,352

[22] Filed: Jan. 4, 1991

[30] Foreign Application Priority Data

Jan. 4, 1990 [SE] Sweden ............................. 9000026

[51] Int. Cl.$^5$ ..................... G01R 33/00; G01R 33/04
[52] U.S. Cl. .................................. 324/253; 324/260
[58] Field of Search ............... 324/247, 253, 254, 255, 324/260, 244

[56] References Cited

U.S. PATENT DOCUMENTS

| | | | |
|---|---|---|---|
| 3,568,052 | 3/1971 | Anderson | 324/253 |
| 3,936,949 | 2/1976 | Devaud | 324/247 |
| 4,591,788 | 5/1986 | Mohri et al. | 324/260 |

Primary Examiner—Walter E. Snow
Attorney, Agent, or Firm—Hodgson, Russ, Andrews, Woods & Goodyear

[57] ABSTRACT

A magnetic field detecting device, particularly for detecting the earth's magnetic field, includes one or more amorphous or microcrystalline magnetic fibres having two bistable magnetization states and surrounded by one single measuring coil (103). The measuring coil is supplied with a periodically changing control signal (101a) which is superposed with a detected signal (103a) contingent on the sensed magnetic field. The detected signal is caused to control a flip-flop (122) which influences the working direction of an integrator (101), the output signal of which forms a performance signal in addition to forming said control signal. The performance signal (101c, 106a) is processed in a microprocessor (107), to which a control signal (122b) is also delivered from the flip-flop, and is able to restart the circuit when a control signal fails to appear.

6 Claims, 3 Drawing Sheets

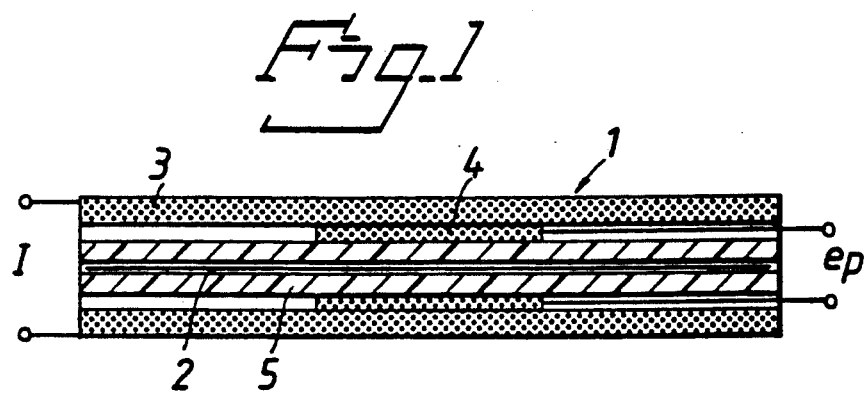
Fig. 1
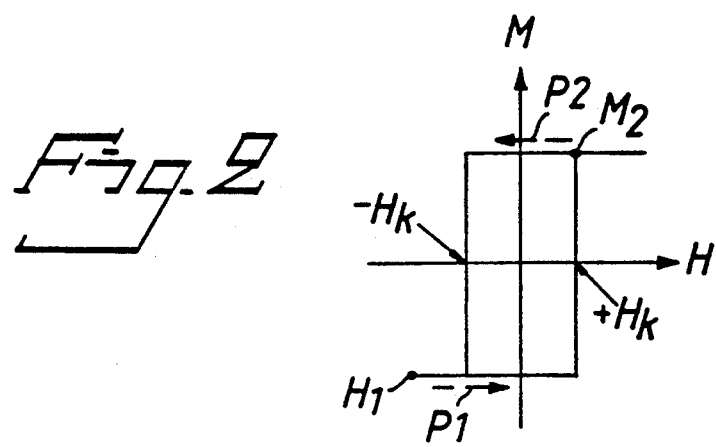
Fig. 2
Fig. 3
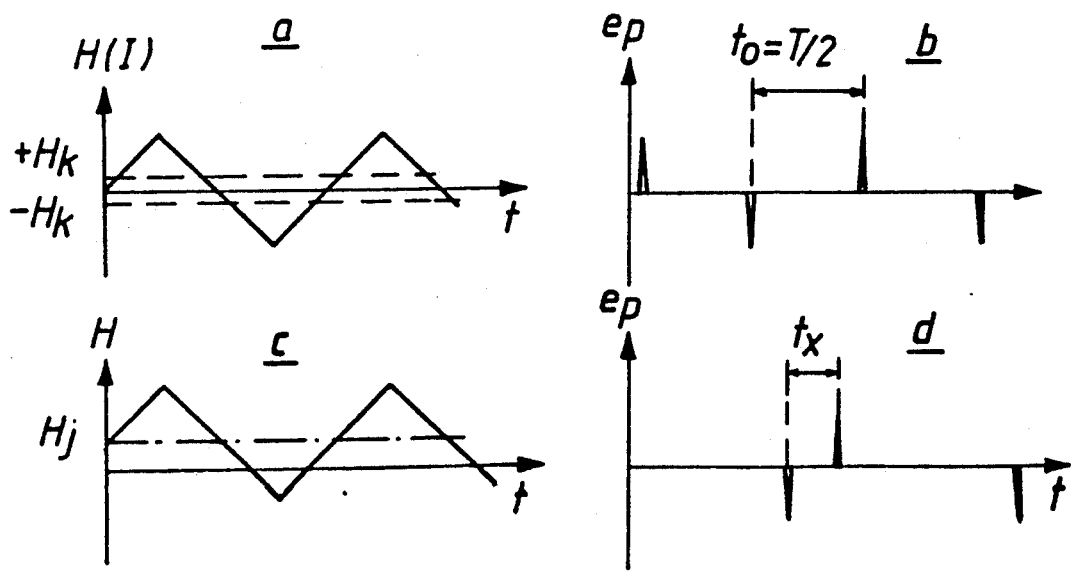

MAGNETIC FIELD DETECTOR FOR DETECTING EARTH'S MAGNETIC FIELD

TECHNICAL FIELD

The present invention relates to a magnetic field detector intended particularly for sensing the earth's magnetic field. The detector includes at least one magnetic field detecting coil means which comprises a sensor and is intended to produce an electric signal commensurate of a value of the sensed magnetic field.

BACKGROUND ART

Devices for determining the earth's magnetic field have long been known in the form of compasses. These normally utilized a point-journalled magnetic needle which adjusts to the north/south direction of the magnetic field and is relatively difficult to read.

More sophisticated compass equipment itilizes electromagnetic sensors comprising different types of solenoids to which electric voltages are applied and which are intended to deliver measuring signals to indicating or reading instruments. Such equipment is used, for instance, as an aid in manoeuvring water-borne vessels and aircraft, and the relatively complicated design of such equipment renders it very expensive.

Such equipment is used, for instance, as an aid in maneuvering water-borne vessels and aircraft, and the relatively complicated design of such equipment renders it very expensive. Such an equipment is described in U.S. Pat. No. 4,503,621 (Fowler) where solid state flux gates are supported on a platform gimballed to maintain a substantially horizontal orientation. Such a flux gate comprises coil means and a magnetically saturable core of so-called Wiegand type.

Magnetic field sensors comprising magnetic elements of Wiegand type are described e.g. in U.S. Pat. No. 4,639,670 (Norman). The drawback in using such an element is among others that it has to be reset after every pulse generated by the magnetic field sensed as discussed in U.S. Pat. No. 4,639,670. Therefore, the control and detection circuits are rather complex.

Another drawback in existing solid state compass and other magnetic field sensor equipment is the use of digital time or frequency measuring for having a value of the magnetic field sought for. Besides the patents mentioned above such a time or frequency measuring method is used for an electronic digital compass described in U.S. Pat. No. 4,918,824 (Farrar) issued Apr. 24, 1990. As is quite clear from this patent, for example shown in FIG. 19, the electronic circuits being used are complex and it is necessary to use two detector coils for every detector core. Though making use of an amorphous reentrant wire core Farrar has not understood to take advantage of the properties of this core material but only replaced the Wiegand core used in the magnetic field detectors of prior art. This means an undesirable waste of energy which can be seen in FIGS. 13 through 16 where the graphs show a drive signal having a large amplitude.

SUMMARY OF THE INVENTION

The object of the present invention is to provide a readily readable and reliable instrument for determining the earth's magnetic field, with the aid of relatively simple means. This object is achieved with the device defined in the introduction in which the The sensor includes an elongated member constructed from one or more magnetic, bistable amorphous metal wires or fibres which are oriented in the direction of the long axis of the member, and in which the sensor is at least partially surrounded by one coil for sensing the magnetic field sought, this coil being intended to alternate the direction of sensor magnetization.

Thus, the sensor of the inventive device is advantageously constructed of one or more amorphous or microcrystalline magnetic metal filaments/fibres, hereinafter solely referred to as fibres, which have two bistable magnetization states. The fibres are fixedly arranged in relation to an object whose direction or orientation relative to the earth's magnetic field is to be determined.

By applying a drive signal through the coil surrounding respective fibres, the fibre is subjected to a reference magnetic field which is caused to alternate periodically and to have a magnitude such that the fibres switch from the one bistable state to the other in time with changes. Thus, for a given alloy and fibre manufacturing process, the voltage pulses induced in the coil will have a clear relationship with the total magnetic field to which the fibre is subjected.

The present invention avails itself of the known properties of certain metal alloys which obtain an amorphous or glass-like crystalline structure through the so-called rapid solidification process. Such alloys have been produced in the form of threads or fibres with the aid of a special process which, briefly, involves injecting the molten metal alloy into a water bath on the inside of a rapidly rotating drum ("in-rotating-water rapid quenching technique") described by I. Ohnaka et al at Proc. 4th Intl. Conf. on Rapidly Quenched Metals, 1982. Amorphous magnetorestrictive wires of this kind have a unique course of magnetizing with solely two permitted states, and are, therefore, normally referred to as bistable. This behaviour is found described by K. Mohri et al in IEEE Trans. Magn., MAG-20, 1984, page 1409.

A PREFERRED EMBODIMENT

The inventive device will now be described in more detail with reference to an exemplifying preferred embodiment thereof illustrated in the accompanying drawings, in which FIG. 1 is a longitudinal sectional view of a prior art magnetic field detecting coil means;

FIG. 2 illustrates the characteristic course of magnetization of a sensor configured with amorphous fibres in accordance with the invention;

FIG. 3 is a curve diagram illustrating the drive and measuring signals according to FIG. 1, wherein FIGS. 3a and b illustrate the course taken by the signals when not influenced by the earth's magnetic field, whereas FIGS. 3c and d illustrate the course taken by said signals under the influence of the earth's magnetic field;

The inventive device provides a new measuring principle for determining magnetic fields and their directional sense in relation to an object. The device includes a magnetic field detecting coil means 1, as shown in FIG. 1. In the preferred embodiment, the coil means 1 includes a sensor 2 designed as a fibre of a magnetic-material having substantially right angled magnetic hysteresis, which may take two different magnetization states such that a bistable function is obtained. This is made by remagnetization of the sensor 2 at a magnetic field which is characteristic to the sensor 2 and in the present case is achieved with the aid of a drive coil 3. Each time the magnetization of the sensor 2 is reversed, there is generated a voltage pulse in a detector coil 4 which is of particular configuration in this case known per se. The detector coil 4 is connected to a measuring circuit registering the time difference between the voltage pulses obtained at reversals generated sequentially. This is shown in FIG. 3.

When using the prior art coil means 1 for measuring magnetic fields, the drive coil 3 is supplied with a current I which provides a triangular wave-shaped magnetic field H, the amplitude of which is greater than the critical magnetic field $H_k$ required to re-magnetize the sensor 2.

FIG. 3a illustrates one such triangular wave-shaped magnetic field H along the time axis t, the magnetic field H thus being generated by the drive coil 3 supplied with the current I. Each time the amplitude of the magnetic field H passes the levels $+H_k$ and $-H_k$ for the critical magnetic field, a short voltage pulse $e_p$ is induced in the detector coil 4, as shown in FIG. 3b. The time interval between each positive voltage pulse is determined by the period time T (the frequency f) of the alternating magnetic field H. The time interval $t_0$ between a positive and negative voltage pulse is half the period time T and when the sensor 2 is not influenced by some other magnetic field.

If the sensor 2 is also influenced by another magnetic field, for instance the earth's magnetic field $H_j$ (FIG. 3c), the time inteval $t_x$ according to FIG. 3d between a positive and a negative pulse will deviate from half the period time $t_0$. This time shift thus constitutes a measurement of the strength of the other magnetic field along the axis of the sensor 2, in accordance with $H_j = At + B$, where A and B are constants, which values are determined by the period time and amplitude of the alternating (triangular shaped) magnetic field.

Figure 4:
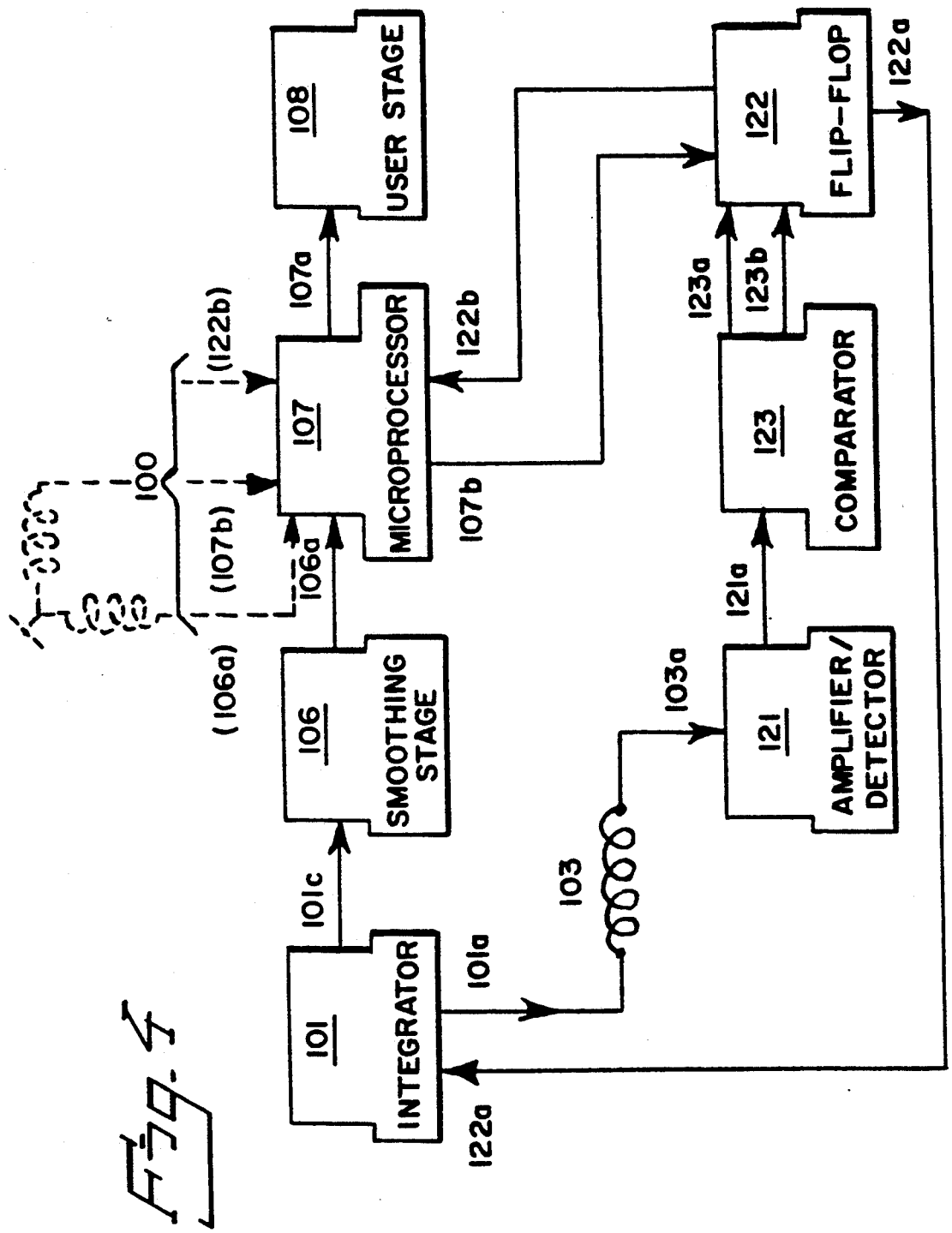
FIG. 4 is a block schematic of a preferred embodiment of the measuring circuit of the inventive detector.
Figure 5:
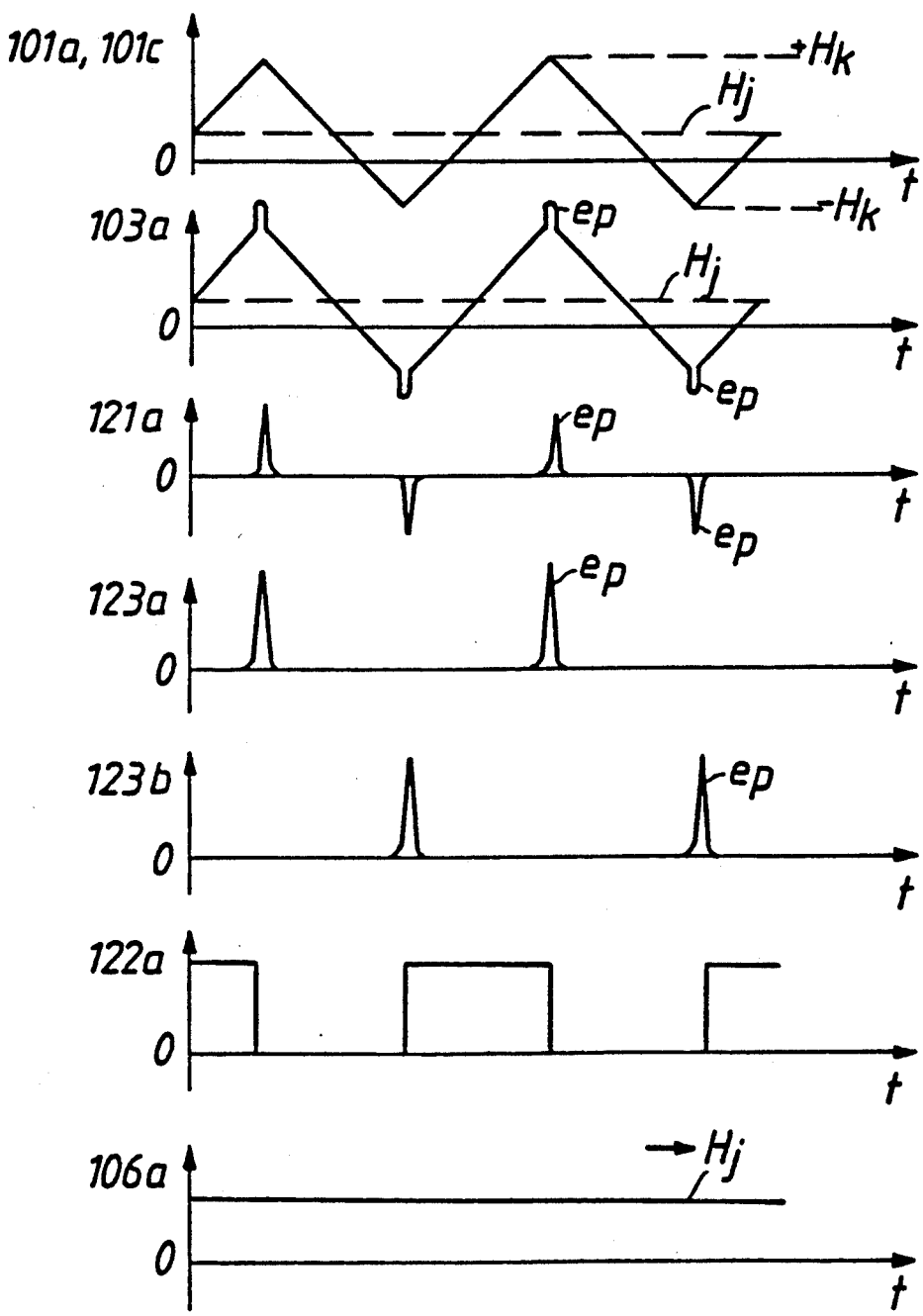
FIG. 5 is a curve diagram of the signals at different points of the circuit illustrated in FIG. 6.

By making the sensor from one or more fibres of an amorphous material it has been possible to obtain essential simplifications and considerable improvements, i.e. from a reliability point of view, of the magnetic field detecting device which is made evident by the following description given with reference to FIGS. 4 and 5.

An amorphous bistable fibre 2 has a characteristic bistable magnetization course illustrated in FIG. 2, which illustrates magnetization M of the fibre as a function of the external magnetic field H. When the magnetic field H increases from the level $H_1$, as indicated by the arrow P1, the magnetization M does not change until a critical magnetic field $+H_k$ is reached. At this moment, the magnetization M is changed rapidly to the level $M_2$. The magnetization M is not changed by continued increase in the magnetic field H. When the magnetic field H decreases, a rapid change in magnetization occurs when the magnetic field H is equal to $-H_k$, as indicated by the arrow P2.

Because the fibre 2 has only two magnetizing states, re-magnetization with external magnetic field H will take place very quickly as soon as a critical magnetic field $H_k$ has been exceeded. In the case of a non-treated rapidly-solidifying fibre, this magnetic field is about 70 mOe (5 A/m). In the case of an appropriately heat treated fibre, the critical field $H_k$ can be caused to reach to about 1 Oe (80 A/m) (R. Malmhäll et al, IEEE Trans. Magn. (1987). The quality and properties of the wires can thus be altered with the aid of different thermal treatment processes.

Having a sensor 2 in the form of such an amorphous bistable fibre the number of coils of the magnetic field detector can be restricted to one coil 103 only as shown in FIG. 4. In particular, FIG. 4 shows a preferred embodiment of the inventive magnetic field detector where the detection of the magnetic field is controlled with the aid of a microprocessor MCU.

Thus, FIG. 4 is a block schematic illustrating a magnetic field detector in which the sensor comprises an amorphous bistable fibre (not shown) surrounded by one single coil 103 which functions both as a drive coil and as a detector coil. The coil 103 is supplied with a drive signal 101a from an integrator 101 and produces an output signal 103a which is influenced by the unknown magnetic field and which is amplified in an amplifying and detecting state 121. This stage 121 thus produces an amplified signal 121a which consists solely of those signal parts which correspond to the unknown magnetic field, i.e. "spikes" $e_p$, which are fed to a comparator 123 in which the "spikes" $e_p$ obtained against the unknown magnetic field are divided into two phase dependent signals 123a and 123b. These phase dependent signals 123a, 123b are caused to activate a bistable flip-flop 122, the output signal 122a of which is applied to the integrator 101 as a "turn signal". Depending on the directional sense of the spikes obtained from the comparator 123, the output of the flip-flop 122 is either set to a high or a low level, which in turn controls the directional sense of the integrator 101 (the self-generated magnetic field through the coil 103). The flip-flop 122 is thus caused to adopt a position which switches the direction of the current and therewith also the directional sense of the magnetic field. When the counter-directed magnetic field corresponds to the switching field of the fibre, the fibre is switched, wherein the voltage pulse induced therein again reverses the current direction. The circuit will thus oscillate at a given frequency (normally 8 kHz).

If no external magnetic field $H_j$ is applied, the circuit will oscillate symmetrically around the reference level, i.e. the rectified mean value will take the value OV relative to the reference level, which is half the supply voltage. On the other hand, if an external magnetic field is applied (the earth's magnetic field $H_j$), the mean value of the occurrent sawtooth voltage will take either a positive or a negative voltage relative to the reference voltage. This voltage is directly proportional to the applied external magnetic field $H_j$.

The integrator 101 delivers a drive signal 101c to a smoothing stage 106, the drive signals 101a and 101c advantageously being identical. A performance signal 106a is delivered from the smoothing stage 106 to a microprocessor 107. Depending on the magnitude of the performance signal 106a, the microprocessor 107 delivers a signal 107a to a user stage 108, which may, for instance, be display stage of the LCD-type and functions to provide direct information relating to the size and directional sense of the magnetic field. Other units may also be connected to the microprocessor 107.

In one embodiment where the preferred embodiment of the magnetic field detector is intended for use as a direction indicating compass arrangement, there is also used two fibres which are disposed substantially at right angles along x- and y-axes as shown in broken lines in FIG. 4, together with associated coils 103. Each coil is driven in the manner illustrated in FIG. 4, although the microprocessor 107 is common to both coils, as indicated by broken-line inputs 100 on the microprocessor 107.

A control signal 122b is applied to the microprocessor 107, in addition to the performance signal 106a. The control signal 122b is obtained from the flip-flop 122 and is intended to assume the aforesaid frequency. This frequency supply will cease upon the occurrence of radio disturbances or other faults or errors in the circuit, which is immediately sensed in the microprocessor 107. The microprocessor 107 will then attempt to restart the circuit, by sending to the flip-flop 122 a clock signal 107b, therewith causing the integrator 101 to change direction. If the disturbance has ceased and the circuit is error free, the process is restarted.

The aforementioned signals 101a, 103a, 121a, $e_p$, 123a, 123b, 122a, 101c, 106a and 107a are illustrated in the curve diagram reproduced in FIG. 5.

As will be seen from FIG. 5, there is also used in this preferred embodiment a drive signal 101a, 101c of triangular wave type. It will be noted, however, that the amplitude of the drive signal 101a, 101c contrary to the case of prior art (compare FIGS. 3a and 3c) never exceeds the levels $+H_k$ and $-H_k$, but lies within these peak values. This results in a not-insignificant energy saving compared to the prior art devices. When the coil 103 senses the external magnetic field to be detected, the peak values of the drive signal 101a, 101c are superposed with "spikes" $e_p$, as shown in the diagram for the output signal 103a. The "spike signal" is cultivated in the amplifying and detecting stage 121, as will be evident from the diagram 121a, and the signal is divided in the comparator 123 into the phase dependent signals 123a, 123b according to the corresponding diagram in FIG. 5. The diagram 122a shows the clock pulses referenced "turn signals" which control the integrator 101. The lowermost diagram 106a shows the d.c. voltage level forming the performance signal applied to the microprocessor 107. This d.c. voltage level is proportional to the earth's magnetic field $H_j$, which in this case is the magnetic field to be detected.

The circuitry used in this preferred embodiment of the inventive magnetic field detector is thus greatly simplified, while at the same time economizing on current consumption.

In an arbitrary case, where the magnetic field $H_j$ forms angles with the direction of the fibre two coil means are suitably arranged at angles to one another, preferably at right angles as mentioned above, for the purpose of determining the components of the unknown magnetic field. Certain embodiments can employ three coil means 103, for instance when there is a need to compensate for yawing. In this case, the three coil means 103 are disposed in corresponding number of mutually perpendicular space planes.

Although the inventive device has been described above with reference to the drawings in respect of a preferred embodiment with the electronics intended for circuit stages at present most advantageous, it will be obvious to one of normal skill in this art that corresponding results can also be obtained with the aid of other circuit embodiments. The present invention is, therefore, not be considered restricted solely to the described and illustrated embodiment, since the invention also embraces the principle magnetic field detecting device defined in the following Claims.

We claim:

1. A magnetic field detecting device, particularly for detecting the earth's magnetic field, comprising at least one magnetic field detecting means having a sensor intended to produce an electric signal as a value of the sensed magnetic field, said sensor including an elongated member in the form of one or more magnetic, bistable amorphous wires or fibres oriented in the direction of the long axis of said member, and having a single coil surrounding said sensor for contemporary detection of the magnetic field sought for and generation of a reference magnetic field, an integrator driving said single coil by a control signal, and a flip-flop activated by the control signal superposed on a pulse signal generated by means operatively connected to the coil and responsive to the sought magnetic field, the output from the flip-flop operatively connected to said integrator for directional control of said integrator.

2. A device according to claim 1, characterized by two or more magnetic field detecting means (1) oriented at angles to one another, preferably right angles, and in that the magnetic field sensing coil (103) within each detecting means together with corresponding magnetic field sensing coil within the other detecting means is connected to a common measuring circuit which functions to determine the directional sense and magnitude of the sensed magnetic field.

3. A magnetic field detecting device, particularly for detecting the earth's magnetic field, comprising at least one magnetic field detecting means (1) which comprises a sensor (2) and is intended to produce an electric signal as a value of the sensed magnetic field, characterized in that the sensor (2) includes an elongated member constructed from one or more magnetic, bistable amorphous metal wires or fibres which are oriented in the direction of the long axis of said member and in that said sensor is at least partially surrounded by one coil (103) operative to sense the sought magnetic field which is intended to alternately change the sensor magnetiztion, the one coil (103) being arranged for contemporary detection of the sought magnetic field and generation of a reference magnetic field, said coil (103) being driven by means of a control signal (101a) produced by an integrator (101), said coil being connected to means causing the sought magnetic field to give rise to a pulse signal (122a) which is superposed on the control signal and which functions to activate a flip-flop (122) operatively connected to the integrator (101) for directional control of the integrator (101), the magnetic field sensing coil (103) being operatively associated with an integrator (101), and further including a measuring circuit (FIG. 4) including a microprocessr (107) to which a performance signal (101c, 106(a)) proportional to the detected magnetic field is delivered from the integrator (101) and also to which a frequency determining control signal (122b) is delivered from the flip-flop (122) in the circuit of the magnetic field sensing coil.

4. A device according to claim 3, characterized in the the microprocessor (107) is intended to deliver a restart signal (107b) to respective flip-flop (122) in the absence of a control signal (122b).

5. A magnetic field detecting device, particularly for detecting the earth's magnetic field, comprising at least one magnetic field detecting means (1) which comprises a sensor (2) and is intended to produce an electric signal as a value of the sensed magnetic field, characterized in that the sensor (2) includes an elongated member constructed from one or more magnetic, bistable amorphous metal wires or fibres which are oriented in the direction of the long axis of said member and in that said sensor is at least partially surrounded by one coil (103) operative to sense the sought magnetic field which is intended to alternately change the sensor magnetization, the one coil (103) being arranged for contemporary detection of the sought magnetic field and generation of a reference magnetic field, said coil (103) being driven by means of a control signal (101a) produced by an integrator (101), said coil being connected to means causing the sought magnetic field to give rise to a pulse signal (122a) which is superposed on the control signal and which functions to activate a flip-flop (122) for directional control of the integrator (101), the device characterized by two or more magnetic field detector means (1) oriented at angles to one another, preferably right angles, and in that the magnetic field sensing coil (103) within each detecting means together with corresponding magnetic field sensing coil within the other detecting means is connected to a common measuring circuit (FIG. 4) which functions to determine the directional sense and magnitude of the sensed magnetic field, each magnetic field sensing coil (103) being operatively associated with an integrator (101), said common measuring circuit including a microprocessor (107) to which a performance signal (101c,106a) proportional to the detected magnetic field is delivered from each integrator (101) and also to which a frequency determining control signal (122b) is delivered from respective flip-flop (122) in the circuits of the magnetic field sensing coils.

6. A device according to claim 5, characterized in that the microprocessor (107) is intended to deliver a restart signal (107b) to respective flip-flop (122) in the absence of a control signal (122b).

* * * * *